US006462394B1

(12) United States Patent
Thakur et al.

(10) Patent No.: US 6,462,394 B1
(45) Date of Patent: Oct. 8, 2002

(54) DEVICE CONFIGURED TO AVOID THRESHOLD VOLTAGE SHIFT IN A DIELECTRIC FILM

(75) Inventors: Randhir P. S. Thakur; Ravi Iyer; Howard Rhodes, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/312,373

(22) Filed: May 13, 1999

Related U.S. Application Data

(63) Continuation of application No. 08/578,825, filed on Dec. 26, 1995, now abandoned.

(51) Int. Cl.[7] .................. H01L 29/00; H01L 23/58; H01L 23/48
(52) U.S. Cl. .............. 257/506; 257/645; 257/649; 257/651; 257/751; 257/639; 257/640
(58) Field of Search .............. 257/506, 639, 257/640, 645, 649, 651, 751

(56) References Cited

U.S. PATENT DOCUMENTS

| | | | | |
|---|---|---|---|---|
| 3,925,572 | A | 12/1975 | Naber | 427/87 |
| 4,708,767 | A | 11/1987 | Bril | 437/18 |
| 4,824,802 | A | 4/1989 | Brown et al. | 437/192 |
| 4,849,797 | A | * 7/1989 | Ukai et al. | 357/237 |
| 4,863,755 | A | 9/1989 | Hess et al. | 427/39 |
| 4,879,257 | A | 11/1989 | Patrick | 437/195 |
| 4,917,759 | A | 4/1990 | Fisher et al. | 156/643 |
| 4,976,856 | A | 12/1990 | Van Der Scheer et al. | 210/490 |
| 4,992,840 | A | * 2/1991 | Haddad et al. | 357/23.15 |
| 5,077,238 | A | 12/1991 | Fujii et al. | 437/228 |
| 5,084,407 | A | 1/1992 | Boland et al. | 437/61 |
| 5,113,790 | A | 5/1992 | Geisler et al. | 118/723 |
| 5,132,239 | A | 7/1992 | Ghezzi et al. | 437/43 |

(List continued on next page.)

FOREIGN PATENT DOCUMENTS

| | | | |
|---|---|---|---|
| EP | 0 327 412 A1 | 8/1989 | H01L/23/28 |
| EP | 0 366 343 B1 | 5/1990 | H01L/21/336 |
| EP | 0 509 631 A1 | 10/1992 | H01L/23/525 |
| EP | 0 366343 B1 | 3/1996 | H01L/21/336 |
| JP | 01-047055 | 2/1989 | H01L/21/90 |
| JP | 03-280543 | 12/1991 | H01L/21/3205 |
| JP | 04-067632 | 3/1992 | H01L/21/3205 |
| JP | 04-326732 | 11/1992 | H01L/21/316 |

OTHER PUBLICATIONS

S. Wolf, "Silicon Processing for the VLSI Era", vol. II, pp. 45, 51, 194–199, 370, 382, 387–388, Jun., 1990.

Butler, John, Greg Allen, Anthony Hall, and Romuald Nowak, "Electrical Characterization of Doped and Undoped PECVD TEOS Oxides", presented at VMIC, Jun. 1990.

*Primary Examiner*—Minh Loan Tran
(74) *Attorney, Agent, or Firm*—Charles Brantley

(57) ABSTRACT

A method of fabricating an integrated circuit having reduced threshold voltage shift is provided. A nonconducting region is formed on the semiconductor substrate and active regions are formed on the semiconductor substrate. The active regions are separated by the nonconducting region. A barrier layer and a dielectric layer are deposited over the nonconducting region and over the active regions. Heat is applied to the integrated circuit causing the barrier layer to anneal.

16 Claims, 1 Drawing Sheet

U.S. PATENT DOCUMENTS

| | | | | |
|---|---|---|---|---|
| 5,164,330 A | | 11/1992 | Davis et al. | 437/192 |
| 5,166,088 A | | 11/1992 | Ueda et al. | 437/47 |
| 5,196,907 A | * | 3/1993 | Birkle et al. | 257/289 |
| 5,223,736 A | | 6/1993 | Rodder | 257/506 |
| 5,236,862 A | | 8/1993 | Pfiester et al. | 437/70 |
| 5,260,232 A | | 11/1993 | Muroyama et al. | 437/187 |
| 5,372,974 A | | 12/1994 | Doan et al. | 437/240 |
| 5,384,288 A | | 1/1995 | Ying | 437/228 |
| 5,399,532 A | | 3/1995 | Lee et al. | 437/228 |
| 5,468,689 A | | 11/1995 | Cunningham et al. | 437/24 |
| 5,474,955 A | | 12/1995 | Thakur | 437/173 |
| 5,504,347 A | | 4/1996 | Jovanovic et al. | 257/25 |
| 5,531,183 A | | 7/1996 | Sivaramakrishnam et al. | 117/93 |
| 5,532,193 A | | 7/1996 | Maeda et al. | 437/243 |
| 5,552,343 A | | 9/1996 | Hsu | 437/195 |
| 5,576,565 A | | 11/1996 | Yamaguchi et al. | 257/296 |
| 5,585,308 A | | 12/1996 | Sardella | 437/190 |
| 5,650,359 A | | 7/1997 | Ahlburn | 437/235 |
| 5,753,547 A | | 5/1998 | Ying | 438/253 |
| 5,874,745 A | * | 2/1999 | Kuo | 257/59 |
| 6,033,979 A | * | 3/2000 | Endo | 438/622 |
| 6,051,509 A | * | 4/2000 | Tsuchiaki | 438/758 R |

* cited by examiner

DEVICE CONFIGURED TO AVOID THRESHOLD VOLTAGE SHIFT IN A DIELECTRIC FILM

RELATED APPLICATIONS

This application is a continuation of U.S. application Ser. No. 08/578,825 filed Dec. 26, 1995, now abandoned.

BACKGROUND OF THE INVENTION

1. Field of the Invention

This invention relates to integrated circuit structures, and in particular, it relates to dielectric materials used within dynamic random access memory cells formed on semiconductor integrated circuits.

2. Background Art

In a conventional transistor a gate is separated from the source and drain by a dielectric layer. When a sufficient voltage level is applied to the gate the transistor turns on and current flows between the source and the drain of the transistor. In a similar manner, when conductors of integrated circuits pass over dielectric layers located above adjacent n-wells or diffusion regions they can cause leakage current to flow between the n-wells or between the diffusion regions. This leakage current is very undesirable.

It is well known in the art of semiconductor fabrication that dielectric layers formed from organic sources can have shifts in their threshold voltage due to impurities in the dielectric material. The impurities are present in the layer because of the organic processes, such as ozone-TEOS based chemistry, which are used to form the material of the dielectric layer.

It is also known for the impurities in the dielectric layer to diffuse and collect at interfaces close to the substrate during high temperature processing steps performed after deposition of dielectric material formed with organometallic precursors. This diffusion can seriously degrade integrated circuit operation.

It is therefore an object of the present invention to provide a process for forming dielectric material for semiconductor fabrication using organic chemistry such as ozone-TEOS based chemistry and organometallic precursors which leave undesirable impurities in the dielectric material.

It is a further object of the present invention to eliminate or reduce threshold voltage shift caused by impurities that are a consequence of the organic processes for forming the dielectric layer.

It is a further object of the present invention to provide such a process for BPSG films that are thicker than at least 5 KA.

It is a further object of the present invention to prevent the problems associated with diffusion of impurities in dielectric layers to interfaces near the surface of the substrate.

These and other objects and advantages of the invention will become more fully apparent from the description and claims which follow or may be learned by the practice of the invention.

SUMMARY OF THE INVENTION

A method of fabricating an integrated circuit having reduced threshold voltage shift is provided. A nonconducting region is formed on the semiconductor substrate and active regions are formed on the semiconductor substrate. The active regions are separated by the nonconducting region. A barrier layer and a dielectric layer are deposited over the nonconducting region and over the active regions. Heat is applied to the integrated circuit causing the barrier layer to anneal. The dielectric layer can be a BPSG film. Preferably BPSG films are deposited using organometallic precursors. More specifically, ozone (4 to 20% vol conc.), TEOS, TEPO (as an example of a P source) and TEB (as an example of a B source) are reacted at a temperature of at least 300° C. such that BPSG films of at least one thousand angstroms are formed at a deposition rate in the range of 500 angstroms/min to 6000 angstroms/min using gas or liquid injection for carrying the species into the reaction chamber. The preferred deposition temperature range is 300° C.–600° C. The deposition may be done at atmospheric or subatmospheric pressure, in a plasma or a non-plasma based reactor and deposition conditions and the dopant concentration can be varied to obtain the desired film properties and composition. Hot wall reactors can also be used for BPSG film deposition.

DESCRIPTION OF THE DRAWINGS

In order that the manner in which the above-recited and other advantages and objects of the invention are obtained can be appreciated, a more particular description of the invention briefly described above will be rendered by reference to a specific embodiment thereof which is illustrated in the appended drawings. Understanding that these drawings depict only a typical embodiment of the invention and are not therefore to be considered limiting of its scope, the invention and the presently understood best mode thereof are described and explained with additional specificity and detail through the use of the accompanying drawings.

DETAILED DESCRIPTION OF THE INVENTION

Figure 1:
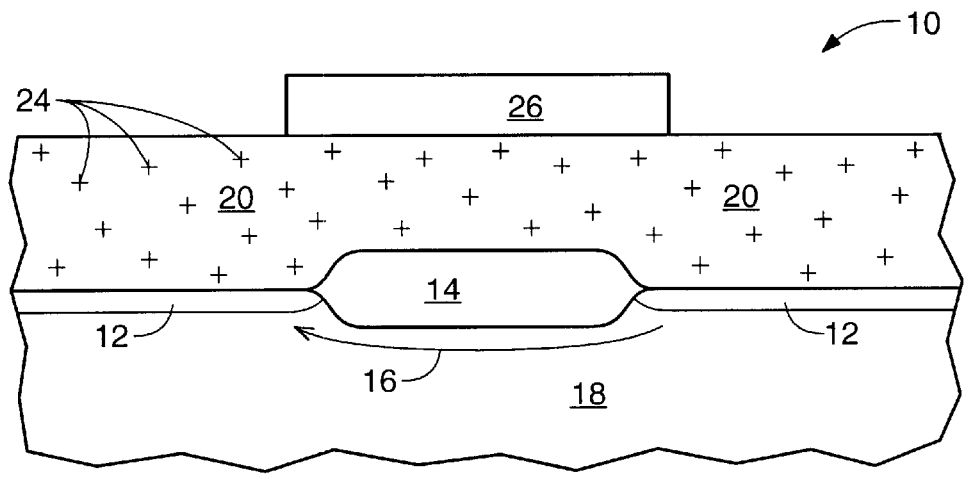
FIG. 1 shows a cross-sectional schematic representation of a prior art semiconductor integrated circuit which may be used in accordance with the method of the present invention.

Referring now to FIG. 1, there is shown a prior art cross-sectional representation of a semiconductor device 10. Active regions 12 are formed within a silicon layer 18. It will be understood by those skilled in the art that the active regions 12 can be any type of diffused regions such as n+, p+, n−, or p− regions or collections of transistors formed within n-wells or p-wells. The active regions 12 are separated from each other by an insulating region 14. It will also be understood by those skilled in the art that the insulating region 14 spacing the active regions apart may be, for example, a field oxide region between two diffusion regions, a trench oxide or any other type of isolating region. Thus, region 14 can be any kind of insulating region between active areas within an n-well or a p-well. A dielectric layer 20 is deposited over the active regions 12 and the field oxide layer 14. The dielectric layer 20 can be formed of, for example, BPSG, BSG, PSG or silicon dioxide. A lead 26 is located above the dielectric layer 20. During use of an integrated circuit formed with the semiconductor device 10 a voltage level on the lead 26 may give rise to a small leakage current 16 between the active regions 12 under the insulating region 14.

Leakage current 16 between isolated active areas in a p-well or an n-well is enhanced by the presence of oxide charges 24 within the dielectric layer 20 upon application of a voltage to lead 26. While oxide charges 24 are indicated with "+" in the drawings for illustrative purposes, it will be understood that oxide charges 24 can be positive or negative. For example, negative charges can be present with an n-well structure and positive charges can be present with a p-well structure. Thus, the leakage current between active areas in an n-well structure is enhanced by the presence of negative oxide charges. If additional oxide charges 24 are present in the dielectric layer 20 the problems associated with oxide charges 24 increase. Thus, when the dielectric layer 20 is formed with a greater thickness, the problems are increased due to the greater amount of oxide charges 24 that are carried by the additional BPSG or other material of the thicker dielectric layer 20. The oxide charges 24 are a substantial problem for thicknesses over one thousand angstroms.

Figure 2:
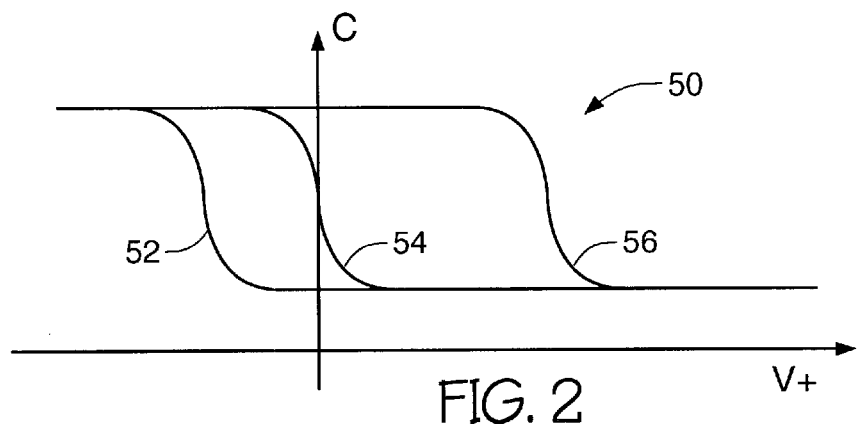
FIG. 2 shows a graphical representation of the threshold voltage shift in integrated circuits that is solved by the method of the present invention.

Referring now to FIG. 2, there is shown a graphical representation 50 for a p-type substrate 18. The graphical representation 50 illustrates the relationship between the voltage applied to the lead 26 and the capacitance in the dielectric layer 20. If there is no oxide charge 24 in the dielectric layer 20 the curve 54 results. If positive charges 24 are present in the dielectric layer 20 the flatband shift of curve 52 results. If negative charges 24 are present in the dielectric layer 20 the flatband shift of curve 56 results.

The primary source of the oxide charges 24 present within the dielectric layer 20 is contamination of the dielectric layer 20. One of the potential sources of the contamination in the dielectric layer 20 can be carbon. The contamination of the layer 20 occurs during production of the BPSG or other type of material forming layer 20. It is well understood that molecules acting as sources of boron, phosphorus and silicon atoms must react with oxygen in order to form the BPSG, BSG, PSG or other material of the dielectric layer 20. The contamination of the dielectric layer 20 can thus occur due to the use of organometallic precursors that can be used to provide the boron, phosphorus, silicon and oxygen atoms of the BPSG of the dielectric layer 20.

For example it is known to form the BPSG material of the dielectric layer 20 by reacting ozone with organic precursors such as $(C_2H_5O)_4Si$ (TEOS) tetraethylorthophosphate (TEPO) and triethylphosphate (TEB) in order to provide the required boron, phosphorus, and silicon atoms. Each of these molecules is an organic molecule containing carbon atoms. The contamination due to the carbon of the organic molecules remains in the BPSG dielectric layer 20 after the reactions forming the BPSG material and cause impurities in the BPSG layer 20. Furthermore, it will be understood that contamination can arise in any other way from the organic precursors and from any other sources. For example, impurities mixed with the organic precursors can cause the contamination. The contamination causes the oxide charges 24 to be present in the dielectric layer 20 and, thereby, causes threshold voltage shift. Other contamination sources can also be present that would give rise to charged regions in oxide.

It is also known in the prior art to obtain the boron, phosphorus and silicon atoms required for forming the BPSG or other material of the dielectric layer 20 from sources that are not organic sources and do not contaminate the layer 20 in this manner. For example, either in the presence of a plasma or at atmospheric pressure, oxygen may be reacted with silane ($SiH_4$), phosphine ($PH_3$) and/or diborane ($B_2H_6$) in order to form BPSG.

However, the use of organometallic precursors such as TEOS, TEPO and TEB to form dielectric materials for semiconductor fabrication is preferred to the use of the inorganic materials for several reasons. The organic reactions permit better control of the fabrication process. For example, the organic reactions provide more precise control of doping and oxide thickness. Furthermore, they permit better step coverage.

Figure 3:
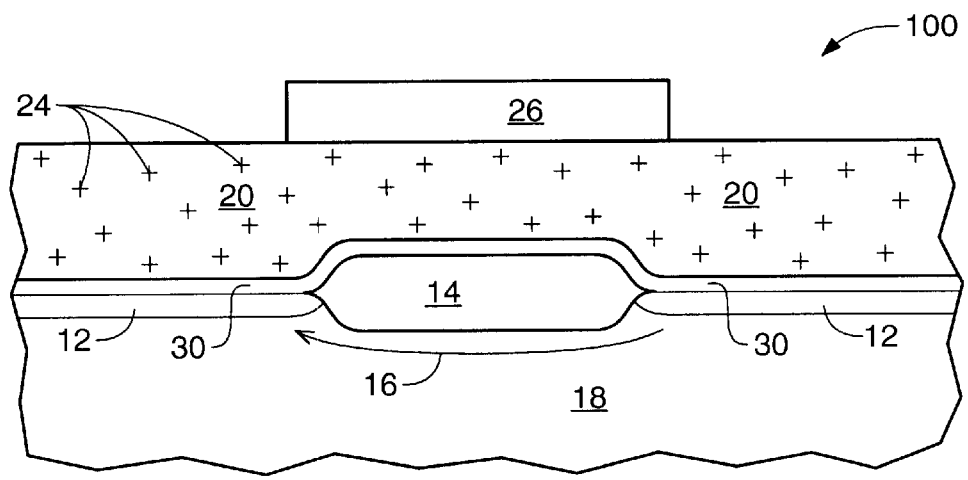
FIG. 3 shows a cross-sectional schematic representation of the semiconductor integrated circuit of FIG. 1 including a barrier layer formed in accordance with the method and structure of the present invention.

Referring now to FIG. 3, there is shown a cross-sectional representation of a semiconductor device 100 formed in accordance with a preferred method of the present invention. The semiconductor device 100 is substantially similar to the semiconductor device 10 except for the addition of a barrier layer 30. The barrier layer 30, is deposited below the dielectric layer 20 and above the active regions 12 and the insulating region 14.

The depositing of layer 20 can be followed by heating the layer 20 to at least 550° C. In one preferred embodiment rapid thermal processing is performed. In rapid thermal processing, the temperature of layers 20 and 30 is raised to between approximately 850° C. and 1050° C. for at least five seconds causing the layer 20 to reflow. In another preferred embodiment the temperature can be raised to approximately 750° C. to 1000° C. in a furnace for at least five minutes. During the reflow of the dielectric layer 20, and during any other subsequent high temperature process steps which may occur, the impurities within the dielectric layer 20 may diffuse. For example, without the barrier layer 30 the impurities may diffuse to the interface between the dielectric layer 20 and the active regions 12 and, more likely, to the interface between the dielectric layer 20 and the insulating region 14 and degrade the performance of the integrated circuit. The barrier layer 30 blocks diffusion of the impurities into the active regions 12 and into the insulating region 14 during the reflow step and/or any other high temperature process steps.

The barrier layer 30 can be formed in many different ways. For example, the barrier layer 30 can, be a silane-based oxide layer or a silane-based oxynitride layer. Additionally, the barrier layer 30 can be a nitride film which can be formed using plasma technology or using non-plasma technology. Additionally, silane-based nitride or nitride with a silane-based oxide stack can be used. Additionally, the layer 30 can be a composite layer formed of layers of silicon dioxide and silicon nitride. Thus, in accordance with the present invention the organic dielectric layer 20 is deposited over any of these barrier layers 30 or barrier stacks 30. The barrier layer 30 formed in this manner can be in the range of approximately fifty angstroms to approximately two thousand angstroms. Preferably, it is between one-hundred and one-thousand angstroms.

Prior to depositing the barrier layer 30 and before forming any of the previously described stacks a plasma treatment of the semiconductor device 10 can be performed. The plasma treatment can be a conventional high voltage plasma treatment using oxygen plasma, ozone plasma, nitrogen plasma, ammonia plasma or a combination of the these gases.

It has been determined that the refractive index of materials can serve as an indication of whether they are suitable for forming the material of the barrier layer 30 of the present invention because the index of refraction of these materials is related to their nitrogen content. The range of satisfactory refractive indices for a material to function as the barrier layer 30 of the present invention is from approximately 1.5 to 2.6. The refractive index of silicon nitride is typically approximately 2.0. The refractive index of oxynitride is typically between approximately 1.46 and 2.0. The refractive index of silicon rich oxynitride is between approximately 2.0 and 2.6. The refractive index of silicon dioxide is approximately 1.46. The refractive index of a composite layer 30 formed of silicon dioxide and silicon nitride is somewhere between the indices of the silicon dioxide and silicon nitride depending on the relative amount of each material used in forming the layer. Although other barrier materials having a refractive index within the range can be used, it will be understood that a material forming the barrier layer 30 must be structurally sound in addition to having a refractive index in this range. It is thus understood that many other materials can be used to form the layer 30. For example, aluminum oxide and aluminum nitride and other insulating materials can be used.

It is to be understood that although the present invention has been described with reference to a preferred embodiment, various modifications, known to those skilled in the art, may be made to the structures and process steps presented herein without departing from the invention as recited in the several claims appended hereto. For example, the use of the barrier layer 30 is taught under the lead 26 and over the active regions 12 and the insulating region 14. In one preferred embodiment, the barrier layer 30 of the present invention may be deposited above n-wells and/or p-wells wherein integrated circuit active regions are formed in the n-wells and/or p-wells in a conventional manner. It will be understood that the method of the present invention prevents n-well to n-well leakage and p-well to p-well leakage as well as preventing leakage between active regions within n-wells or p-wells. Furthermore, the method of the present invention may be used to prevent metal field leakage and poly field leakage in general.

What is claimed is:

1. A semiconductor device, comprising:
   an electrically conductive member;
   a dielectric layer under said conductive member, said dielectric layer containing a dopant and a contaminant;
   a contaminant barrier under said dielectric layer;
   an insulating region under said contaminant barrier; and
   a plurality of electrically conductive regions under said contaminant barrier and flanking said insulating region.

2. The semiconductor device in claim 1, wherein said contaminant barrier comprises at least one material selected from an oxide, an oxynitride, a nitride, and combinations thereof.

3. The semiconductor device in claim 2, wherein said contaminant barrier comprises at least two materials selected from an oxide, an oxynitride, a nitride, and combinations thereof.

4. The semiconductor device in claim 2, wherein said electrically conductive member comprises a lead.

5. A circuit device, comprising:
   a conductive structure configured to receive a voltage;
   a first insulation portion under said conductive structure, said first insulation portion including an organic contaminant;
   a second insulation portion under said first insulation portion, said second insulation portion having an index of refraction ranging from 1.5 to 2.6; and
   a substrate under said second insulation portion and comprising:
      an electrically conductive first region,
      an electrically conductive second region, and
      an insulation region between said first region and said second region.

6. The circuit device in claim 5, wherein said first region is a first active area within a well; and said second region is a second active area within said well.

7. The circuit device in claim 5, wherein said first region is a first well and said second region is a second well.

8. The circuit device in claim 5, wherein said first region is a first n-well and said second region is a second n-well.

9. An insulative stack between a top conductive member and a lower-lying plurality of conductive areas, said insulative stack comprising:
   an insulating region between said plurality of conductive areas;
   a carbon barrier over said insulating region; and
   a carbon-containing dielectric over said carbon barrier and under said top conductive member.

10. The insulative stack in claim 9, wherein said insulating region comprises a field oxide.

11. The insulative stack in claim 9, wherein said insulating region comprises a trench oxide.

12. A barrier between a dielectric contaminated with an electrically chargeable material and an insulating region generally free of said electrically chargeable material, said barrier comprising insulation for an integrated circuit device, wherein said insulation defines a first interface with said dielectric and a second interface with said insulating region; and wherein said first interface has a first concentration of said electrically chargeable material that is greater than a second concentration of said electrically chargeable material at said second interface.

13. The barrier in claim 12, wherein said insulation comprises aluminum oxide.

14. The barrier in claim 12, wherein said insulation comprises aluminum nitride.

15. The barrier in claim 12, wherein said insulation has a thickness ranging from 50 Angstroms to 2000 Angstroms.

16. The barrier in claim 15, wherein said insulation has a thickness ranging from 100 Angstroms to 1000 Angstroms.

* * * * *

UNITED STATES PATENT AND TRADEMARK OFFICE
CERTIFICATE OF CORRECTION

PATENT NO. : 6,462,394 B1  
DATED : October 8, 2002  
INVENTOR(S) : Thakur et al.

It is certified that error appears in the above-identified patent and that said Letters Patent is hereby corrected as shown below:

<u>Column 3,</u>
Line 42, replace "tetraethylorthophosphate" with -- triethylphosphate --;
Line 43, replace "triethylphosphate" with -- triethylborane --.

Signed and Sealed this

Thirteenth Day of May, 2003

JAMES E. ROGAN
*Director of the United States Patent and Trademark Office*